US008698574B2

(12) United States Patent
Sugiura et al.

(10) Patent No.: US 8,698,574 B2
(45) Date of Patent: Apr. 15, 2014

(54) HIGH-FREQUENCY SWITCH

(75) Inventors: Masayuki Sugiura, Kanagawa-ken (JP); Noriyasu Kurihara, Kanagawa-ken (JP); Toshiki Seshita, Kanagawa-ken (JP); Hirotsugu Wakimoto, Kanagawa-ken (JP); Yoshitomo Sagae, Kanagawa-ken (JP); Toshiyuki Shimizu, Kanagawa-ken (JP); Yoshio Itagaki, Kanagawa-ken (JP); Masanori Ochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 13/046,937

(22) Filed: Mar. 14, 2011

(65) Prior Publication Data

US 2012/0038411 A1 Feb. 16, 2012

(30) Foreign Application Priority Data

Aug. 11, 2010 (JP) .................................. 2010-179959

(51) Int. Cl.
*H01P 1/10* (2006.01)
*H01P 1/15* (2006.01)

(52) U.S. Cl.
USPC .......................................... 333/101; 333/103

(58) Field of Classification Search
USPC .......................... 333/101, 103, 104, 105, 107
See application file for complete search history.

(56) References Cited

U.S. PATENT DOCUMENTS

| 5,856,713 A * | 1/1999 | Huettner et al. ............... 307/125 |
| 2010/0073066 A1 | 3/2010 | Seshita et al. |
| 2012/0182061 A1 | 7/2012 | Seshita et al. |

FOREIGN PATENT DOCUMENTS

| JP | 08-172163 A | 7/1996 |
| JP | 2001-144207 | 5/2001 |
| JP | 2005-033350 | 2/2005 |
| JP | 2006-147676 | 6/2006 |
| JP | 2010-022030 A | 1/2010 |
| JP | 2010-067664 A | 3/2010 |
| JP | 2010-074027 A | 4/2010 |

OTHER PUBLICATIONS

Japanese Office Action issued on Dec. 26, 2013 in corresponding Japanese Application No. 2010-179959, along with English translation.

* cited by examiner

*Primary Examiner* — Dean O Takaoka
(74) *Attorney, Agent, or Firm* — White & Case LLP

(57) ABSTRACT

According to one embodiment, a high-frequency switch includes a high-frequency switch IC chip. The high-frequency switch IC chip has a high-frequency switching circuit section including an input terminal, a plurality of switching elements, a plurality of high-frequency signal lines, and a plurality of output terminals. The input terminal is connected to each of the plurality of output terminals via each of the plurality of switching elements with the high-frequency signal lines having the same lengths. The plurality of output terminals are arranged on a surface at an outer periphery of the high-frequency switch IC chip. The input terminal is arranged on the surface of the high-frequency switch IC chip at the center of the high-frequency switch IC circuit section.

19 Claims, 8 Drawing Sheets

HIGH-FREQUENCY SWITCH

CROSS-REFERENCE TO RELATED APPLICATIONS

This application is based upon and claims the benefit of priority from the prior Japanese Patent Application No. 2010-179959, filed on Aug. 11, 2010; the entire contents of which are incorporated herein by reference.

FIELD

Embodiments described herein relate generally to a high-frequency switch.

BACKGROUND

A switch IC in which a switching circuit is formed on an SOI (Silicon On Insulator) substrate is utilized as a high-frequency switch because of its small capacitance resulting from the substrate. Such a high-frequency switch IC can be formed in an existing silicon process without using an expensive compound semiconductor and a complicated process peculiar to processing the compound semiconductor, and thus it is suitable for cost reduction. Moreover, since the high-frequency switch IC can also include a CMOS (Complementary Metal Oxide Semiconductor) circuit in the same chip, high integration of the high-frequency switch IC and miniaturization of a high-frequency switch module incorporating the IC therein are possible.

Thereby, an SPnT (Single Pole n Throw) high-frequency switch circuit in which an antenna terminal is used as an input terminal and a plurality of connection terminals between the switch circuit and a transmission circuit and a reception circuit as output terminals and a control circuit can be formed into one chip on the SOI substrate. When a plurality of output terminals is present, since wiring lengths within the chip from the input terminal to respective output terminals are different, an input impedance of the high-frequency switch IC when viewed from the input terminal is different depending on which one of the output terminals the input terminal connects to. Hence, depending on combination of the input terminal and output terminals, the high-frequency switch IC will mismatch with characteristic impedance of the high-frequency line of the antenna, resulting in increase of reflection loss of the high-frequency switch IC. As a result, variation in output characteristics of the high-frequency switch IC will be large among the output terminals.

DETAILED DESCRIPTION

Figure 1:
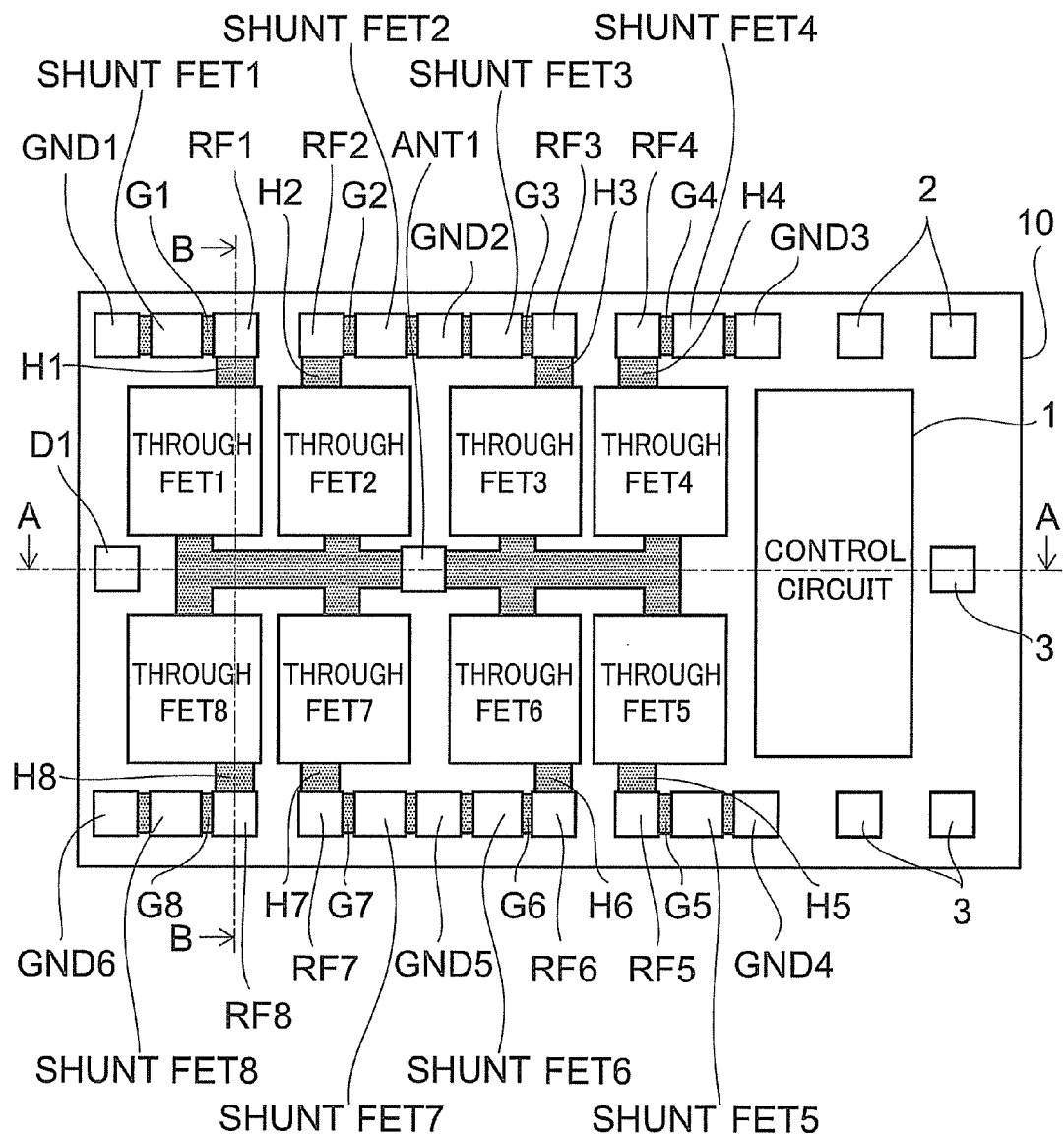
FIG. 1 is a top view of a high-frequency switch IC chip of a high-frequency switch according to a first embodiment.

In general, according to one embodiment, a high-frequency switch includes a high-frequency switch IC chip. The high-frequency switch IC chip has a high-frequency switching circuit section including an input terminal, a plurality of switching elements, a plurality of high-frequency signal lines, and a plurality of output terminals. The input terminal is connected to each of the plurality of output terminals via each of the plurality of switching element with the high-frequency signal lines having the same lengths. The plurality of output terminals are arranged on a surface at an outer periphery of the high-frequency switch IC chip. The input terminal is arranged on the surface of the high-frequency switch IC chip at the center of the high-frequency switch IC circuit section.

Hereinafter, embodiments will be described with reference to drawings. Drawings used for description in examples are merely schematic ones for ease of description, and shapes, sizes, magnitude relations, etc. of respective elements in the drawings are not necessarily scaled in practical implementation, but may be suitably changed within a scope in which the effects of the embodiments can be achieved.

A high-frequency switch provided between an antenna and a transmission/reception circuit includes SPDT (Single Pole Double Throw) composed of one antenna terminal and two input/output terminals, DPDT (Double Pole Double Throw) composed of two antenna terminals and two input/output terminals, SPnT (Single Pole n Throw) composed of one antenna terminal and a large number of input/output terminals, or DPnT (Double Pole n Throw) composed of two antenna terminals and a large number of input/output terminals. In each embodiment described below, a high-frequency switch of SP8T is described as an example of one-input/multiple-output switch, and the embodiment can also be implemented for another mode switch similarly because only the number of the input/output terminals is different from the SP8T switch. Moreover, although a case in which a switch element is an n channel MOSFET (Metal Oxide Semiconductor Field Effect Transistor) is described, it is also possible to use another FET, such as a p channel MOSFET, and a HEMT (High Electron Mobility Transistor).

First Embodiment

Figure 2:
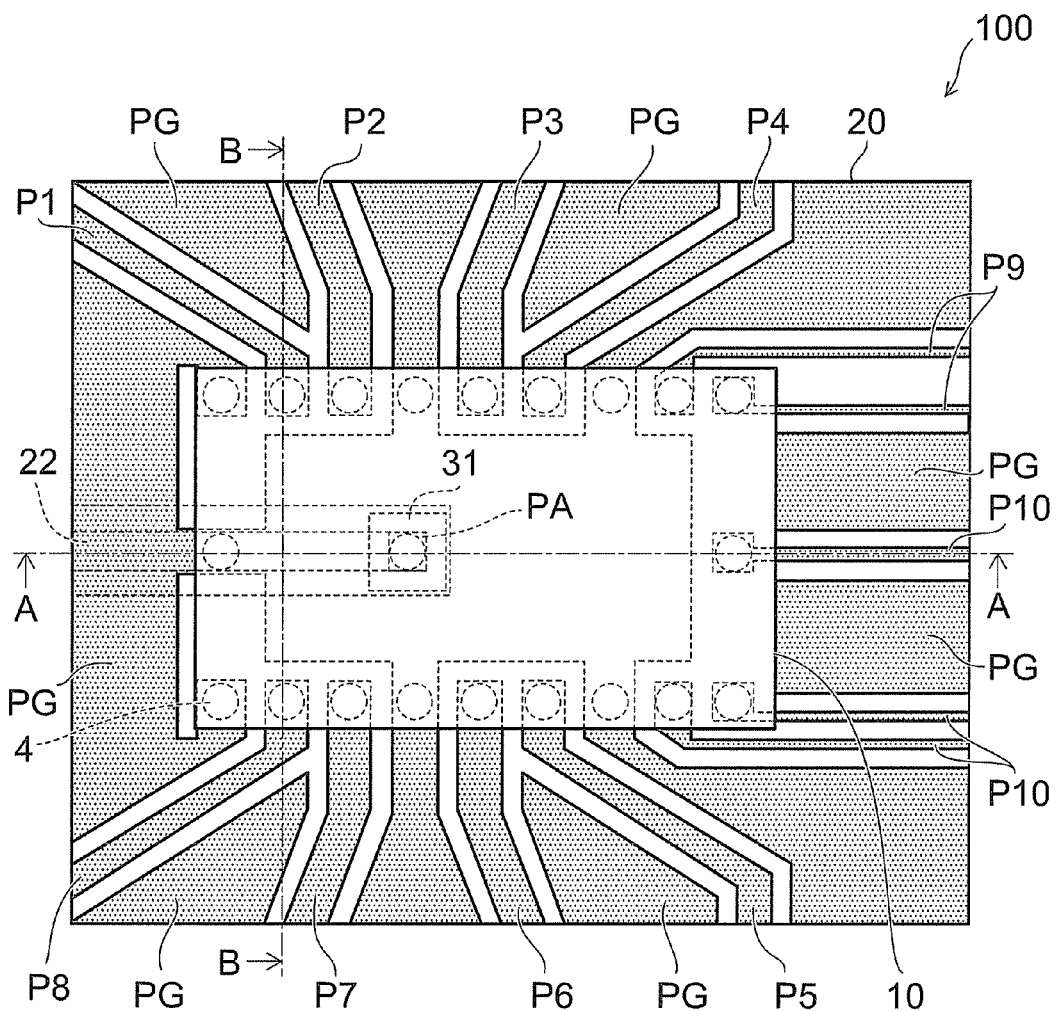
FIG. 2 is a top view of the main part of the high-frequency switch according to the first embodiment.
Figure 3:
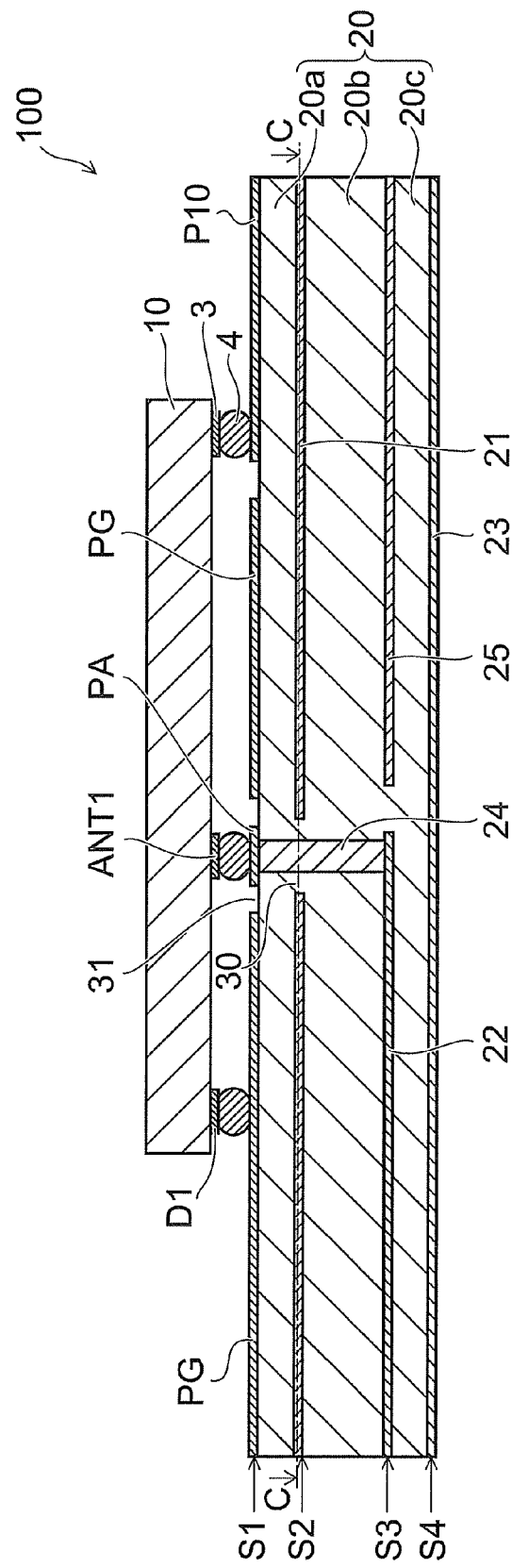
FIG. 3 is a cross-sectional view of the main part of the high-frequency switch according to the first embodiment.
Figure 4:
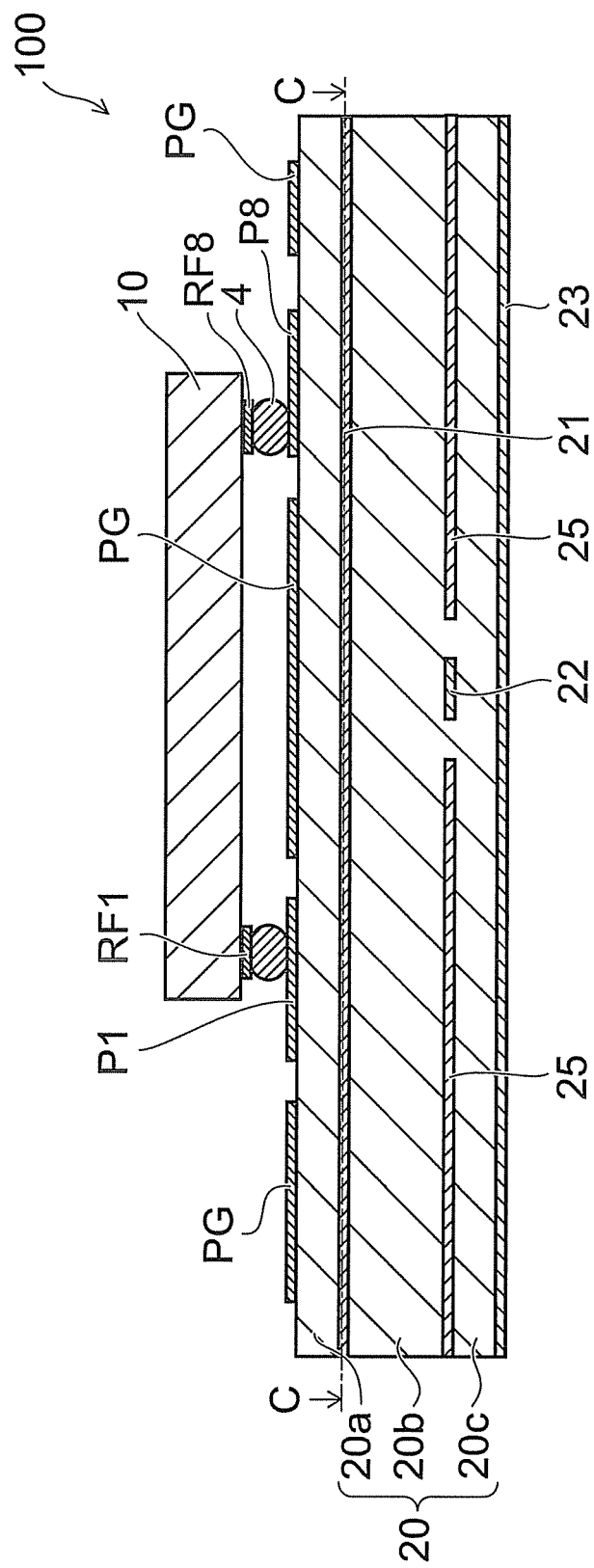
FIG. 4 is a cross-sectional view of the main part of the high-frequency switch according to the first embodiment.
Figure 5:
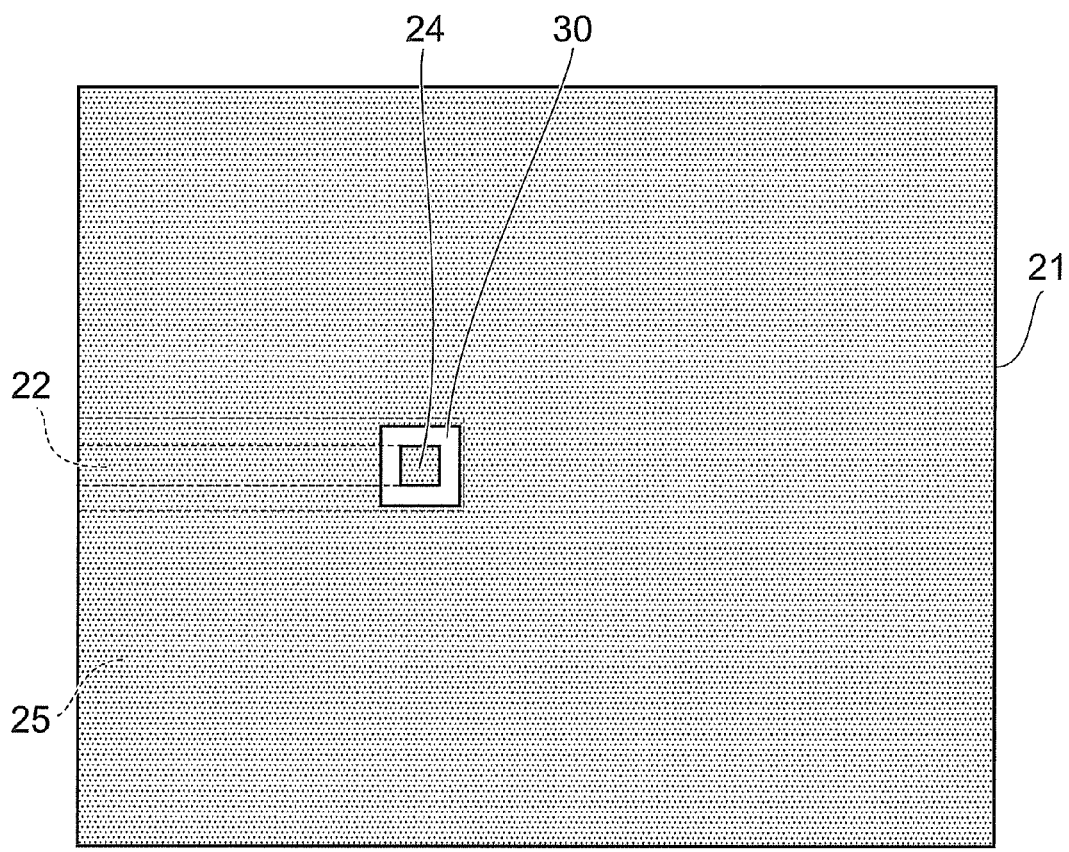
FIG. 5 is a horizontal cross-sectional view of the main part of the high-frequency switch according to the first embodiment.

With reference to FIG. 1 to FIG. 5, a high-frequency switch according to a first embodiment will be described. FIG. 1 is a top view of a high-frequency switch IC chip 10 of a high-frequency switch 100 according to the first embodiment. FIG. 2 is a top view of the main part of the high-frequency switch as viewed from above in a state in which the high-frequency switch IC chip 10 is flip-chip mounted on a wiring substrate with the surface facing downward. FIG. 3 illustrates a cross-section along line A-A in FIG. 2. FIG. 4 illustrates a cross-section along line B-B in FIG. 2. The cross-sections along line A-A and line B-B in FIG. 2 correspond to the cross-sections of the high-frequency switch IC chip 10 along line A-A and line B-B in FIG. 1, respectively. FIG. 5 is a horizontal cross-section of the main part of the high-frequency switch along line C-C in FIG. 3 and FIG. 4.

The high-frequency switch 100 according to the first embodiment includes: an SP8T high-frequency switch IC chip 10 having an input terminal ANT1 and output terminals RF1 to RF8 connected to the input terminal ANT1 via a through-FET1 to a through-FET8, respectively; and a wiring substrate 20.

The high-frequency switch IC chip 10 is configured as follows. The high-frequency switch IC chip 10 includes the input terminal ANT1 that receives a high-frequency signal from an antenna. The output terminal RF1 outputting the high-frequency signal from the antenna is connected to the input terminal ANT1 by a high-frequency signal line H1 via the through-FET1. In the case where a transmission circuit is connected to the output terminal, the high-frequency signal is input to the output terminal and output to the antenna via the input terminal ANT1. The same holds true for other output terminals. The through-FET1 is a switching element which is ON/OFF-controlled by a control circuit 1 incorporated in the high-frequency switch IC chip 10, and MOSFET is used as an example. The same holds true for other through-FETs described below. The output terminal RF1 is connected to a ground terminal GND1 by a ground line G1 via a shunt-FET1. The shunt-FET1 is a switching element which is ON/OFF controlled by the control circuit 1 like the through-FET1, and MOSFET is used as an example. The same holds true for other shunt-FETs described below. When the input terminal ANT1 is electrically connected to the output terminal RF1, the through-FET1 is turned ON and the shunt-FET1 is turned OFF. When the input terminal ANT1 is not electrically connected to the output terminal RF1, the through-FET1 is turned OFF and the shunt-FET1 is turned ON. Electrical connection between the output terminal RF1 and the ground terminal GND1 by the shunt-FET1 allows circuits in the latter stage of the output terminal RF1 to be reliably isolated from the input terminal ANT1.

The output terminal RF2 outputting the high-frequency signal from the antenna is connected to the input terminal ANT1 by a high-frequency signal line H2 via the through-FET2. The through-FET2 is a switching element which is ON/OFF-controlled by the control circuit 1 like the through-FET1. The output terminal RF2 is connected to a ground terminal GND2 by a ground line G2 via a shunt-FET2. The shunt-FET2 is a switching element which is ON/OFF-controlled by the control circuit 1 like the through-FET1. When the input terminal ANT1 is electrically connected to the output terminal RF2, the through-FET2 is turned ON and the shunt-FET2 is turned OFF. When the input terminal ANT1 is not electrically connected to the output terminal RF2, the through-FET2 is turned OFF and the shunt-FET2 is turned ON. Electrical connection between the output terminal RF2 and the ground terminal GND2 by the shunt-FET2 allows circuits in the latter stage of the output terminal RF2 to be reliably isolated from the input terminal.

The output terminal RF3 outputting the high-frequency signal from the antenna is connected to the input terminal ANT1 by a high-frequency signal line H3 via the through-FET3. The through-FET3 is a switching element which is ON/OFF-controlled by the control circuit 1 like the through-FET1. The output terminal RF3 is connected to a ground terminal GND3 by a ground line G3 via a shunt-FET3. The shunt-FET3 is a switching element which is ON/OFF-controlled by the control circuit 1 like the through-FET1. When the input terminal ANT1 is electrically connected to the output terminal RF3, the through-FET3 is turned ON and the shunt-FET3 is turned OFF. When the input terminal ANT1 is not electrically connected to the output terminal RF3, the through-FET3 is turned OFF and the shunt-FET3 is turned ON. Electrical connection between the output terminal RF3 and the ground terminal GND2 by the shunt-FET3 allows circuits in the latter stage of the output terminal RF3 to be reliably isolated from the input terminal.

The output terminal RF4 outputting the high-frequency signal from the antenna is connected to the input terminal ANT1 by a high-frequency signal line H4 via the through-FET4. The through-FET4 is a switching element which is ON/OFF-controlled by the control circuit 1 like the through-FET1. The output terminal RF4 is connected to a ground terminal GND3 by a ground line G4 via a shunt-FET4. The shunt-FET4 is a switching element which is ON/OFF-controlled by the control circuit 1 like the through-FET1. When the input terminal ANT1 is electrically connected to the output terminal RF4, the through-FET4 is turned ON and the shunt-FET4 is turned OFF. When the input terminal ANT1 is not electrically connected to the output terminal RF4, the through-FET4 is turned OFF and the shunt-FET4 is turned ON. Electrical connection between the output terminal RF4 and the ground terminal GND3 by the shunt-FET4 allows circuits in the latter stage of the output terminal RF4 to be reliably isolated from the input terminal.

The output terminal RF5 outputting the high-frequency signal from the antenna is connected to the input terminal ANT1 by a high-frequency signal line H5 via the through-FET5. The through-FET5 is a switching element which is ON/OFF-controlled by the control circuit 1 like the through-FET1. The output terminal RF5 is connected to a ground terminal GND4 by a ground line G5 via a shunt-FET5. The shunt-FET5 is a switching element which is ON/OFF-controlled by the control circuit 1 like the through-FET1. When the input terminal ANT1 is electrically connected to the output terminal RF5, the through-FET5 is turned ON and the shunt-FET5 is turned OFF. When the input terminal ANT1 is not electrically connected to the output terminal RF5, the through-FET5 is turned OFF and the shunt-FET5 is turned ON. Electrical connection between the output terminal RF5 and the ground terminal GND4 by the shunt-FET5 allows circuits in the latter stage of the output terminal RF5 to be reliably isolated from the input terminal.

The output terminal RF6 outputting the high-frequency signal from the antenna is connected to the input terminal ANT1 by a high-frequency signal line H6 via the through-FET6. The through-FET6 is a switching element which is ON/OFF-controlled by the control circuit 1 like the through-FET1. The output terminal RF6 is connected to a ground terminal GND5 by a ground line G6 via a shunt-FET6. The shunt-FET6 is a switching element which is ON/OFF-controlled by the control circuit 1 like the through-FET1. When the input terminal ANT1 is electrically connected to the output terminal RF6, the through-FET6 is turned ON and the shunt-FET6 is turned OFF. When the input terminal ANT1 is not electrically connected to the output terminal RF6, the through-FET6 is turned OFF and the shunt-FET6 is turned ON. Electrical connection between the output terminal RF6 and the ground terminal GND5 by the shunt-FET6 allows circuits in the latter stage of the output terminal RF6 to be reliably isolated from the input terminal.

The output terminal RF7 outputting the high-frequency signal from the antenna is connected to the input terminal ANT1 by a high-frequency signal line H7 via the through-FET7. The through-FET7 is a switching element which is ON/OFF-controlled by the control circuit 1 like the through-FET1. The output terminal RF7 is connected to a ground terminal GND5 by a ground line G7 via a shunt-FET7. The shunt-FET7 is a switching element which is ON/OFF-controlled by the control circuit 1 like the through-FET1. When the input terminal ANT1 is electrically connected to the output terminal RF7, the through-FET7 is turned ON and the shunt-FET7 is turned OFF. When the input terminal ANT1 is not electrically connected to the output terminal RF7, the through-FET7 is turned OFF and the shunt-FET7 is turned ON. Electrical connection between the output terminal RF7 and the ground terminal GND5 by the shunt-FET7 allows circuits in the latter stage of the output terminal RF7 to be reliably isolated from the input terminal.

The output terminal RF8 outputting the high-frequency signal from the antenna is connected to the input terminal ANT1 by a high-frequency signal line H8 via the through-FET8. The through-FET8 is a switching element which is ON/OFF-controlled by the control circuit 1 like the through-FET1. The output terminal RF8 is connected to a ground terminal GND6 by a ground line G8 via a shunt-FET8. The shunt-FET8 is a switching element which is ON/OFF-controlled by the control circuit 1 like the through-FET1. When the input terminal ANT1 is electrically connected to the output terminal RF8, the through-FET8 is turned ON and the shunt-FET8 is turned OFF. When the input terminal ANT1 is not electrically connected to the output terminal RF8, the through-FET8 is turned OFF and the shunt-FET8 is turned ON. Electrical connection between the output terminal RF8 and the ground terminal GND6 by the shunt-FET8 allows circuits in the latter stage of the output terminal RF8 to be reliably isolated from the input terminal.

The high-frequency switch IC chip 10 includes two power supply terminals 2 on the chip surface. A voltage necessary for operating the control circuit, which drives the through-FET1 to the through-FET8 and the shunt-FET1 to the shunt-FET8, is supplied to the power supply terminals 2. The high-frequency switch IC chip 10 includes three control terminals 3 on the chip surface. A 3-bit control signal is supplied to the control circuit via the control terminals 3. The control circuit 1 supplies a power supply voltage to gate electrodes of the through-FETs and the shunt-FETs via gate wirings (not illustrated) connected to the through-FETs and the shunt-FETs so that ON/OFF combination of the through-FETs and the shunt-FETs corresponds to the 3-bit control signal.

The high-frequency switch IC chip 10 includes: a high-frequency switch circuit section having the input terminal 1, the output terminals RF1 to RF8, the through-FETs 1 to 8, and the shunt-FETs 1 to 8; and the control circuit 1 in parallel with the high-frequency switch circuit section. The output terminals RF1 to RF8 and the ground terminals GND1 to GND6 are arranged at the outer periphery of the high-frequency switch IC chip, and the input terminal ANT1 is arranged nearly at the center of the high-frequency switch circuit section. The input terminal ANT1 and the output terminals RF1 to RF8 are arranged on the chip surface so that the high-frequency signal lines H1 to H8 connecting respective output terminals and the input terminal ANT1 have an almost equal length not depending on the output terminals. By making respective high-frequency signal lines between respective output terminals and the input terminal have almost equal length, difference in the input impedance of the input terminal due to difference in the output terminals can be made small, and thus the output characteristics of the output terminals of the high-frequency switch IC chip can be made almost the same. Although the lengths of respective high-frequency signal lines H1 to H8 are made almost to be equal, in order to make the output characteristics of the output terminals fall within specification, difference in length between each of the high-frequency signal lines H1 to H8 on the IC chip needs to be within 1/32 of the wavelength of each of the high-frequency signal lines.

The power supply terminals 2 and the control terminals 3 are arranged at the outer periphery of the high-frequency switch IC chip 10 near the control circuit 1. The output terminals RF1 to RF8, the ground terminals GND1 to GND6, the power supply terminals 2, and the control terminals 3 are arranged at substantially equal intervals along the outer periphery in the longitudinal direction of the high-frequency switch IC chip. The input terminal ANT1, the output terminals RF1 to RF8, the ground terminals GND1 to GND6, the power supply terminals 2, and the control terminals 3 are metal electrode pads made of a metal such as aluminum, copper, and gold and provided on the top surface of the high-frequency switch IC chip 10, respectively. At positions between long sides of the chips where intervals between terminals are relatively long, for example, at the intermediate between the ground terminals GND1 and GND6 in FIG. 1, a dummy electrode pad D1 not electrically connected to the high-frequency switch IC chip 10 is provided. In addition, at the intermediate between the power supply electrodes 2 and the control terminals 3, another control terminal 3 is arranged. By equalizing distances between respective terminals in this manner, influence by stress derived from heat generated during operation due to flip-chip mounting described below can be made small.

As illustrated in FIG. 2 to FIG. 4, the wiring substrate 20 includes first to third ceramic layers 20a to 20c made of ceramics and first to fourth wiring layers S1 to S4. The first wiring layer S1 is formed on the surface of the first ceramic layer. The second wiring layer S2 is disposed between the first and the second ceramic layers. The third wiring layer S3 is disposed between the second and the third ceramic layers. The fourth wiring layer S4 is disposed on the bottom surface of the third ceramic layer.

As illustrated in FIG. 2 and FIG. 3, the first wiring layer S1 includes ground wirings PG grounded at the outside of the high-frequency switch 100, an input terminal wiring PA, output terminal wirings P1 to P8, power supply terminal wirings P9, and control terminal wirings P10. When the high-frequency switch IC chip 10 is flip-chip mounted with the surface thereof facing the first wiring layer, each of the output terminal wirings P1 to P8, the ground terminal wirings PG, the power supply terminal wirings P9, and the control terminal wirings P10 is formed so as to extend on the top surface of the first ceramic layer 20a from respective positions, facing the output terminals RF1 to RF8, the ground terminals GND1 to GND6, the power supply terminal 2, and the control terminals 3, toward edge portions of the wiring substrate 20. The ground wiring PG has a first portion facing the high-frequency switch IC chip, and extends to the edge portion of the wiring substrate 20 from the first portion via a position facing the ground terminal. Furthermore, the ground wirings PG are arranged between respective adjacent output terminal wirings P1 to P8, to electromagnetically separate each output terminal wiring in a horizontal direction. That is, neighboring output terminal wirings are formed with the ground wiring PG interposed therebetween so as not to be influenced by the high-frequency signal of the neighboring output terminal wirings. The input terminal wiring PA is formed on the first ceramic layer 20a at the opening 31 (second opening) provided at the first portion of the ground wiring PG, the portion being a position facing the input terminal ANT1 of the high-frequency switch IC chip 10. The input terminal wiring PA is also separated from the output terminal wirings P1 to P8 via the ground wiring PG and electromagnetically separated from them in a horizontal direction. Similarly, the power supply terminal wiring P9 and the control terminal wiring P10 are formed so as to be separated from other kinds of wirings via the ground wiring PG.

The second wiring layer has the first ground layer grounded at the outside of the high-frequency switch IC chip. As illustrated in FIG. 5, as viewed from above, the first ground layer has a planar region which fully contains the high-frequency switch IC chip 10 therein, and has an opening 30 (first opening) at a position corresponding to the input terminal 10 of the high-frequency switch IC chip. The opening 30 is arranged directly under the opening 31. Each of the output terminal wirings P1 to P8 forms a micro-strip line with the first ground layer 21 and the first ceramic layer 20a, respectively. The sizes of them are set so that characteristic impedance becomes 50 ohms.

The third wiring layer S3 has an input signal wiring 22. In the opening 30 of the first ground layer 21, a conductor via 24, which penetrates through the second ceramic layer 20b and the first ceramic layer 20a, is electrically connected to the input terminal wiring PA at one end, and is electrically connected to the input signal wiring 22 at the other end, is formed. The input signal wiring 22 extends on the third ceramic layer to the end of the wiring substrate, in the shape of a stripe, for example. The third wiring layer S3 further has a ground layer 25 (third ground layer) formed so as to surround the input signal wiring 22 in a horizontal plane. The ground layer 25 is grounded at the outside of the high-frequency switch 100, and provided so that the influence of the high-frequency signal from the input signal wiring 22 is not imparted to the outside of the ground layer 25 in a horizontal direction.

A fourth wiring layer has the second ground layer formed on the bottom surface of the third ceramic layer. The second ground layer is grounded at the outside of the high-frequency switch 100, and, as viewed from above, it has a planar region sufficiently containing the high-frequency switch IC chip 10 therein.

As illustrated in FIG. 3 and FIG. 4, the input signal wiring 22 forms a strip line with the first ground layer 21, the second ceramic layer 20b, the third ceramic layer 20c, and the second ground layer 23. The input signal wiring 22 extends inside the wiring substrate 20 while being sandwiched between the first ground layer 21 and the second ground layer 23, until it is drawn out to the outside of the wiring substrate 20 from the conductor via 24 formed directly under the input terminal ANT1 (not illustrated). Each size of them is set so that the characteristic impedance of the input signal wiring 22 becomes 50 ohms. In addition, even if formation of the second ground layer 23 is eliminated, the input signal wiring 22 is formed as a micro-strip line under the first ground layer 21 via the second ceramic layer 20b, and thus, in this case also, each size of them needs to be set so that the characteristic impedance of the input signal wiring 22 becomes 50 ohms.

In addition, it is sufficient for ground wiring PG, the input terminal wiring PA, the output terminal wirings P1 to P8, the power supply terminal wiring P9, the control terminal wiring P10, the first ground layer 21, the input signal wiring 22, the second ground layer 23, the ground layer 25, and the conductor via 24 to be made of a metal material having a high melting point. For example, tungsten can be used.

In order to electrically connect the input terminal ANT1, the output terminals RF1 to RF8, the ground terminals GND1 to GND6, the power supply terminals 2, the control terminals 3, and the dummy electrode pad D1 to the input terminal wiring PA, the output terminal wirings P1 to p8, the ground terminal wiring PG, the power supply terminal wiring P9, the control terminal wiring P10, and the ground terminal wiring PG via the solder bumps 4, respectively, the high-frequency switch IC chip 10 is flip-chip mounted on the wiring substrate 20 so that its surface faces the first wiring layer S1 of the wiring substrate. Gold (Au) bumps can be used as well as solder bumps. The terminals of the high-frequency switch IC chip 10 are drawn out to the outside of the high-frequency switch 100 from portions of the wiring substrate 20 (not illustrated) via wirings corresponding to the terminals formed in the first wiring layer of the wiring substrate, respectively.

The input terminal ANT1 of the high-frequency switch IC chip 10 is drawn out to the outside of the high-frequency switch 100 from portions (not illustrated) via the input terminal wiring PA, the conductor via 24 and the input signal wiring 22 of the wiring substrate 20. Signals from the antenna are supplied to the input terminal ANT1. Alternatively, signals are supplied to the antenna from the input terminal ANT1. The output terminals RF1 to RF8 are connected to respective reception circuits or transmission circuits. The ground terminals GND1 to GND6 are grounded. To the power supply terminals 2, a voltage necessary for operating the control circuit, which drives the through-FET1 to through-FET8 and shunt-FET1 to shunt-FET8, is supplied. To the control terminals 3, a 3-bit signal determining the combination of ON/OFF of the through-FET1 to through-FET8 and shunt-FET1 to shunt-FET8 is supplied.

In addition, it is also possible to mold the wiring substrate 20 and the high-frequency switch IC chip 10 with resin so as to cover them. As a method of drawing out the terminals to the outside of the high-frequency switch 100, the terminals can be drawn out on the bottom surface of the third ceramic layer 20c, by forming conductor vias electrically connected to each of the wiring layers of the first wiring layer so as to penetrate through the third ceramic layer 20c, the second ceramic layer 20b, and the first ceramic layer 20a from the fourth wiring layer side at the end of the wiring substrate. With regard to the input terminal ANT1, it can also be drawn out on the bottom surface of the third ceramic layer 20c, by forming a conductor via electrically connected to the input signal wiring 22 of the third wiring layer so as to penetrate through the third ceramic layer 20c at the end of the wiring substrate 20. Moreover, as an example, the ground layer PG in the first wiring layer S1 and the first ground layer 21 in the second wiring layer S2, the third ground layer 25 in the third wiring layer S3 and the second ground layer 23 in the fourth wiring layer S4 can also be electrically connected to each other by the conductor vias each penetrating through respective ground layers, and the first to the third ceramic layers 20a to 20c.

As mentioned above, the high-frequency switch 100 includes the high-frequency switch IC chip 10 and the wiring substrate 20. When a control signal is input into the control terminal 3, the control circuit 1 applies a voltage necessary for driving to the gate electrodes of a through-FET and a shunt-FET to be turned into ON state, in order to electrically connect the output terminal to be connected and the input terminal ANT1. Electric connection between the input terminal ANT1 and each of the output terminals RF1 to RF8 is controlled by the control signal input into the control terminal.

In the high-frequency switch IC chip 10 of the high-frequency switch 100, the output terminals RF1 to RF8 and the ground terminals GND1 to GND6 are arranged at the outer periphery of the high-frequency switch IC chip 10, and the input terminal ANT1 is arranged substantially at the center of the high-frequency switch circuit section. The input terminal ANT1 and the output terminals RF1 to RF8 are arranged on the chip surface so that the high-frequency signal lines H1 to H8 connecting respective output terminals and the input terminal ANT1 have an almost equal length not depending on the output terminals. By making the high-frequency signal lines H1 to H8 between the output terminals and the input terminal have almost the same length, difference in the input impedance of the input terminal due to difference in the output terminals can be made small, and thus the output characteristics of the output terminals of the high-frequency switch IC chip can be made almost the same.

Furthermore, in the high-frequency switch 100 according to the embodiment, the input terminal ANT1 of the high-frequency switch IC chip 10 is drawn out to the outside of the high-frequency switch 100 using the input signal wiring 22 formed in the wiring substrate 20. The input signal wiring 22 forms a strip line with the first ground layer 21, the second ceramic layer 20b, the third ceramic layer 20c, and the second ground layer 23. That is, the input signal wiring 22 forms the strip line, while being sandwiched between the first ground layer 21 and the second ground layer 23, and separated from the first ground layer 21 and the second ground layer 23 via a ceramic layer. The input signal wiring 22 extends in the wiring substrate 20 while being sandwiched between the first ground layer 21 and the second ground layer 23, until it is drawn out to the outside of the wiring substrate 20 from the conductor via 24 formed directly under the input terminal ANT1 (not illustrated). Each size of them is set so that the characteristic impedance of the input signal wiring 22 becomes 50 ohms. In this manner, since the input terminal ANT1 is drawn out to the outside of the high-frequency switch 100 by the input signal wiring 22 forming a strip line, in the high-frequency switch 100 according to the embodiment, reflection loss of the high-frequency signal of the input terminal can be suppressed to the minimum. Furthermore, since the input signal wiring 22 is electromagnetically separated from the output terminal wirings RF1 to RF8 by the first ground layer formed in the second wiring layer, signals of the input wiring and signals of the output wiring can be separated well. Moreover, by arranging the ground wiring PG between respective output terminal wirings RF1 to RF8 in the first wiring layer, signal separation between the output terminal wirings can be carried out well. Since the high-frequency switch IC chip 10 is mounted by flip-chip mounting, the thickness of the high-frequency switch can be suppressed compared to the cases of wire-bonding, etc., and thus miniaturization of the high-frequency switch can be achieved.

Second Embodiment

Figure 6:
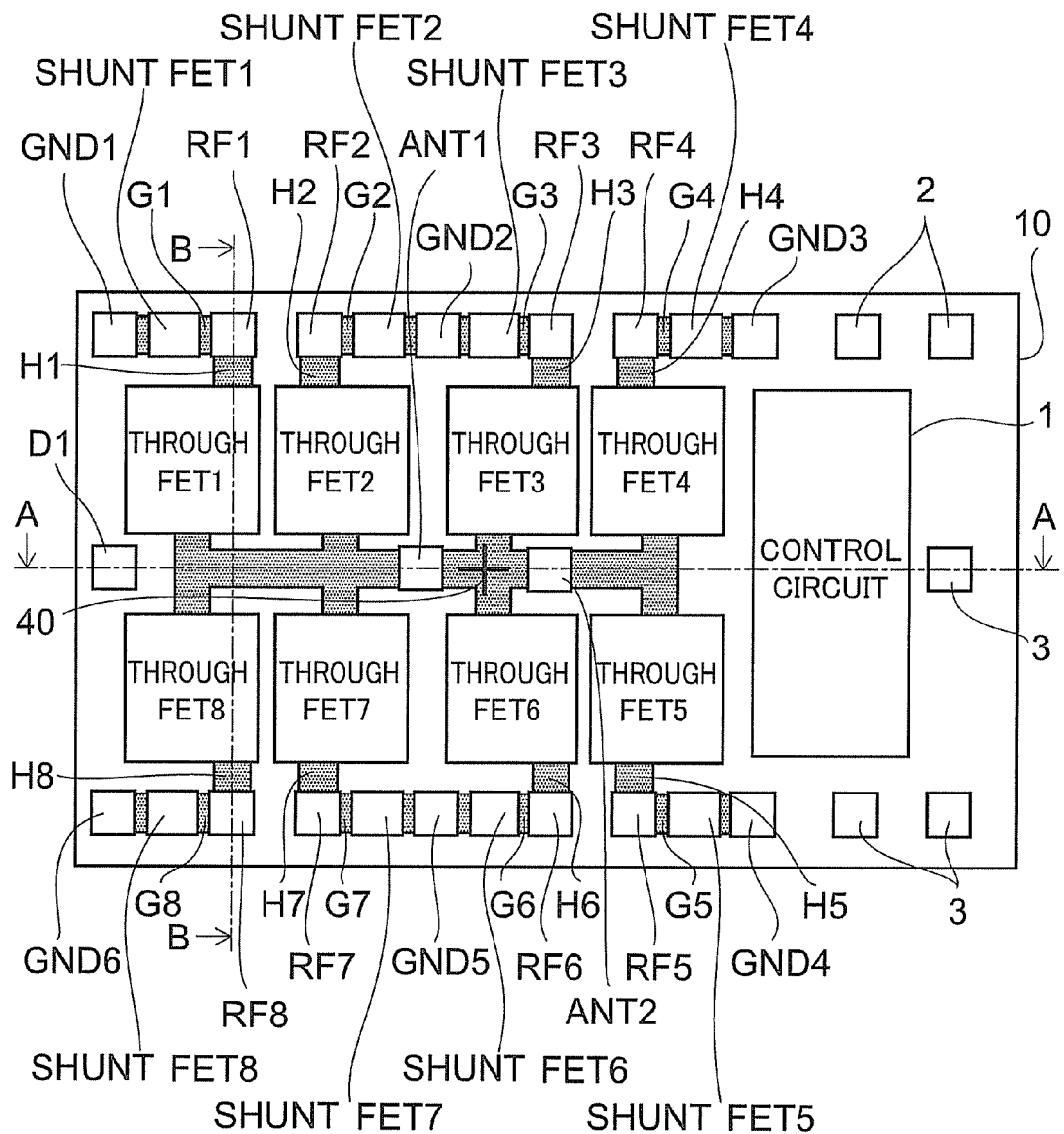
FIG. 6 is a top view of a high-frequency switch IC chip of a high-frequency switch according to a second embodiment.
Figure 7:
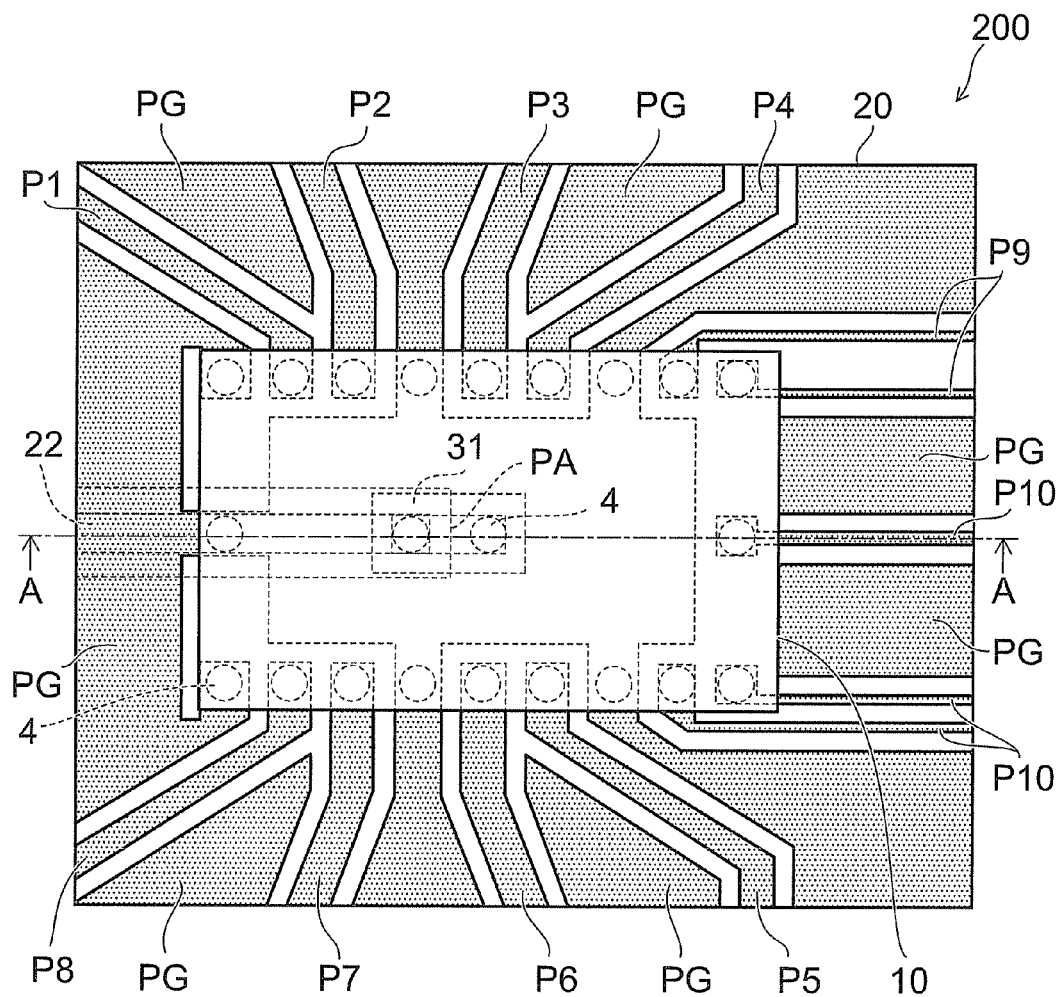
FIG. 7 is a top view of the main part of the high-frequency switch according to the second embodiment.
Figure 8:
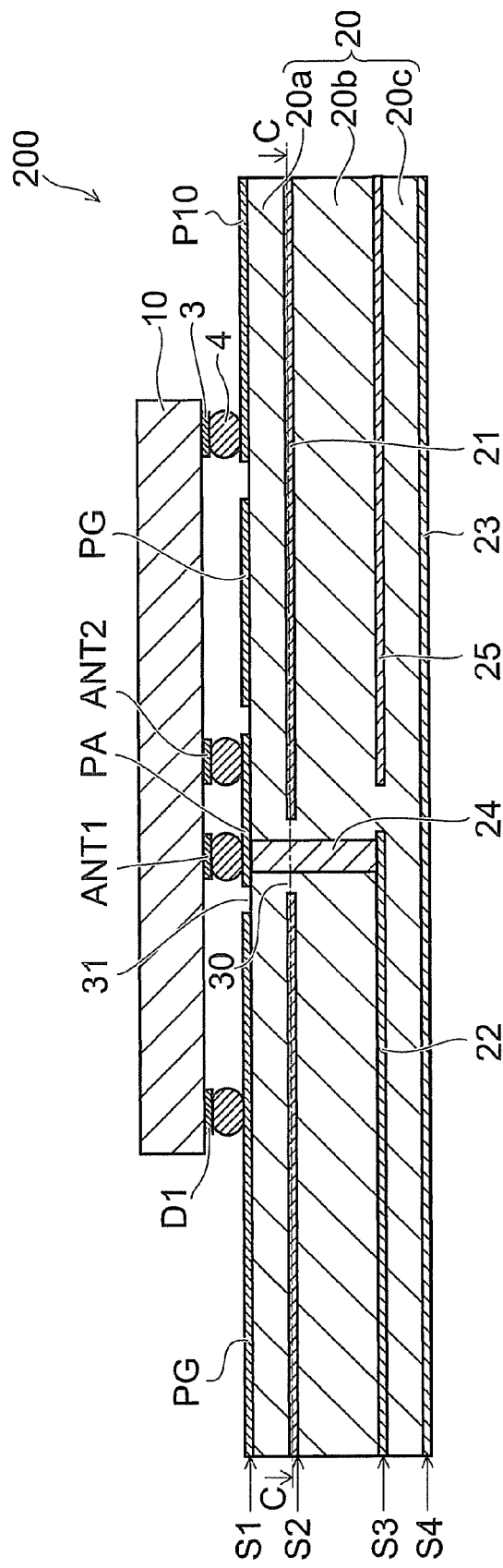
FIG. 8 is a cross-sectional view of the main part of the high-frequency switch according to the second embodiment.

With reference to FIG. 6 to FIG. 8, a high-frequency switch according to a second embodiment will be described. FIG. 6 is a top view illustrating a high-frequency switch IC chip 10 of the high-frequency switch 200 according to the second embodiment. FIG. 7 is a top view of the high-frequency switch IC chip 10 as viewed from above in a state where the high-frequency switch IC chip 10 is flip-chip mounted on a wiring substrate with the surface thereof facing downward. FIG. 8 illustrates a cross-section along line A-A in FIG. 7. The cross-section along line A-A in FIG. 7 corresponds to the cross-section of the high-frequency switch IC chip 10 along line A-A in FIG. 6. In addition, components with the same configurations as those described in the first embodiment will be denoted by the same reference numerals, respectively, and descriptions thereof will be omitted. Hereinafter, differences with respect to the first embodiment will be described mainly.

The high-frequency switch 200 according to the embodiment differs from the high-frequency switch 100 according to the first embodiment in the following respects. As illustrated in FIG. 6 to FIG. 8, the high-frequency switch 200 has another input terminal ANT2 besides the input terminal ANT1 of the high-frequency switch 100. The input terminal ANT1 is arranged at a position shifted from the central point 40 of the high-frequency switch IC chip 10. Because, as mentioned above, the high-frequency switch circuit section and the control circuit 1 are arranged in parallel in the high-frequency switch IC chip 10, and the input terminal ANT 1 is arranged substantially at the center of the high-frequency switch circuit section so that lengths of the first to eighth high-frequency signal lines H1 to H8 become the same. The input terminal ANT2 is located at a position point-symmetric to the input terminal ANT1 with respect to the center point 40 of the high-frequency switch IC chip. The input terminal ANT2 is electrically connected to the input terminal ANT1 via a wiring on the IC chip. The input terminal ANT2, similar to the input terminal ANT1 is formed of a metal electrode pad on the surface of the high-frequency switch IC chip 10. The input terminal ANT2, similar to the input terminal ANT1, is electrically connected to the same input terminal wiring PA via a solder bump. A Gold (Au) bump can be used as well as a solder bump. Therefore, as illustrated in FIG. 7 and FIG. 8, the area of the input terminal wiring PA is wider than that of the high-frequency switch 100 according to the first embodiment. Except for the above mentioned respects, the high-frequency switch 200 according to the embodiment is the same as the high-frequency switch 100 according to the first embodiment.

In the high-frequency switch 200 according to the embodiment, similar to the high-frequency switch 100 according to the first embodiment, the output terminals RF 1 to RF 8 and the ground terminals GND1 to GND6 are arranged at the outer periphery of the high-frequency switch IC chip 10, and the input terminal ANT 1 is arranged substantially at the center of the high-frequency switch circuit section. By making distances of the high-frequency signal lines H1 to H8 between respective output terminals and the input terminal almost be the same one, difference in the input impedance depending on difference in the output terminals can be made small, and thus the output characteristics of the output terminals of the high-frequency switch IC chip can be made almost the same.

Moreover, in the high-frequency switch 200 according to the embodiment, similar to the high-frequency switch 100 according to the first embodiment, the input terminal ANT1 of the high-frequency switch IC chip 10 is drawn out to the outside of the high-frequency switch 100 using the input signal wiring 22 formed in the wiring substrate 20. The input signal wiring 22 forms a strip line, while being sandwiched between the first ground layer 21 and the second ground layer 23, and separated from the first ground layer 21 and the second ground layer 23 via a ceramic layer. Each size of them is set so that the characteristic impedance of the input signal wiring 22 becomes 50 ohms. As a result, the high-frequency switch 200 according to the embodiment can also suppress the reflection loss of the high-frequency signal of the input terminal to the minimum. Furthermore, in the high-frequency switch 200 according to the embodiment, similar to the high-frequency switch 100 according to the first embodiment, since the input signal wiring 22 is electromagnetically separated from the output terminal wirings RF1 to RF8 by the first ground layer formed in the second wiring layer, signal separation between the input wiring and the output wiring can be carried out well. Moreover, by arranging the ground wiring PG between respective output terminal wirings RF1 to RF8 in the first wiring layer, signal separation between the respective output terminal wirings can be carried out well. Since the high-frequency switch IC chip 10 is mounted on the substrate 20 by flip-chip mounting, the thickness of the high-frequency switch can be suppressed compared to the cases of wire-bonding, etc., and thus miniaturization of the high-frequency switch can be achieved.

Furthermore, the high-frequency switch 200 according to the embodiment includes the input terminal ANT1 and the input terminal ANT2 at point-symmetric positions with respect to the central point 40 of the high-frequency switch IC chip 10. Because the two input terminals are included at the point-symmetric positions, influences of stress due to heat generated during operation of the high-frequency switch 200 can be received homogeneously at the surroundings of the center of the high-frequency switch IC chip. Hence, as compared with the high-frequency switch 100 according to the first embodiment, which receives the influence of the thermal stress by only one side of the central point of the high-frequency switch IC chip 10, the high-frequency switch 200 improves reliability against destruction due to its heat history.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A high frequency switch comprising:
a high frequency switch IC chip having a high-frequency switching circuit section including an input terminal, a plurality of switching elements, a plurality of high-frequency signal lines, and a plurality of output terminals, each of the plurality of high-frequency signal lines connecting the input terminal and each of the plurality of output terminals via each of the plurality of switching elements, each of the plurality of output terminals being arranged on a surface at an outer periphery of the high-frequency switch IC chip, the input terminal being arranged on the surface of the high-frequency switch IC chip in a region of the high-frequency switch IC circuit section to make a length of each of the plurality of high-frequency signal lines substantially the same; and
a wiring substrate including a first wiring layer, a second wiring layer, and a third wiring layer arranged in an order of the first wiring layer, the second wiring layer, and the third wiring layer,
the surface of the high-frequency switch IC chip being arranged to face the first wiring layer,
the first wiring layer including a ground wiring, a plurality of output terminal wirings, and an input terminal wiring connected to the input terminal, each of the plurality of output terminal wirings being connected to each of the plurality of output terminals,
the second wiring layer including a first ground layer having a planar region including the high-frequency switch IC chip inside the planar region as viewed from the high-frequency switch IC chip toward the first ground layer,
the third wiring layer including an input signal wiring separated from the high-frequency switch IC chip, the first ground layer being interposed between the input signal wiring and the high-frequency switch IC chip, and
the wiring substrate including a conductor via, the conductor via being electrically connected to the input terminal wiring at one end and being electrically connected to the input signal wiring at one other end.

2. The switch according to claim 1, wherein
the wiring substrate further includes a fourth wiring layer arranged on a side of the third wiring layer opposite to the second wiring layer, and
the fourth wiring layer includes a second ground layer having a planar region including the high-frequency switch IC chip inside the planar region as viewed from the high-frequency switch IC chip toward the second ground layer.

3. The switch according to claim 2, wherein the input terminal wiring is arranged in a opening of the ground wiring.

4. The switch according to claim 3, wherein the third wiring layer further includes a third ground layer surrounding the input signal wiring in a horizontal plane.

5. The switch according to claim 4, wherein the ground wiring, the first ground layer, the second ground layer, and the third ground layer are electrically connected to each other with one other conductor via in the wiring substrate.

6. The switch according to claim 5, wherein
one other input terminal electrically connected to the input terminal is arranged at a position point-symmetric to the input terminal with respect to the center point on the surface of the high-frequency switch IC chip,
the input terminal is electrically connected to the input terminal wiring of the wiring substrate via a bump, and
the one other input terminal is electrically connected to the input terminal wiring of the wiring substrate via one other bump.

7. The switch according to claim 6, wherein the plurality of output terminal wirings of the first wiring layer are separated from each other in a horizontal plane with the ground wiring interposed between the output terminal wirings.

8. The switch according to claim 2, wherein the third wiring layer further includes a third ground layer surrounding the input signal wiring in a horizontal plane.

9. The switch according to claim 2, wherein the high-frequency switch IC chip further includes a control terminal configured to receive a control signal, a control circuit configured to control a voltage of a gate electrode of the switching element depending on the control signal, and a power supply terminal configured to supply a voltage necessary for operating the control circuit to the control circuit.

10. The switch according to claim 2, wherein the high-frequency switch IC chip further includes a dummy electrode pad on the surface at the outer periphery of the high-frequency switch IC chip, the dummy electrode pad being insulated from the high-frequency switch IC chip and joined to the ground wiring of the first wiring layer via a bump.

11. The switch according to claim 2, wherein
one other input terminal electrically connected to the input terminal is arranged at a position point-symmetric to the input terminal with respect to the center point on the surface of the high-frequency switch IC chip,
the input terminal is electrically connected to the input terminal wiring of the wiring substrate via a bump, and
the one other input terminal is electrically connected to the input terminal wiring of the wiring substrate via one other bump.

12. The switch according to claim 2, wherein the plurality of output terminal wirings of the first wiring layer are separated from each other in a horizontal plane with the ground wiring interposed between the output terminal wirings.

13. The switch according to claim 1, wherein the input terminal wiring is arranged in a opening of the ground wiring.

14. The switch according to claim 1, wherein the third wiring layer further includes a third ground layer surrounding the input signal wiring in a horizontal plane.

15. The switch according to claim 14, wherein the ground wiring, the first ground layer, and the third ground layer are electrically connected to each other with one other conductor via in the wiring substrate.

16. The switch according to claim 1, wherein the high-frequency switch IC chip further includes a control terminal configured to receive a control signal, a control circuit configured to control a voltage of a gate electrode of the switching element depending on the control signal, and a power supply terminal configured to supply a voltage necessary for operating the control circuit to the control circuit.

17. The switch according to claim 1, wherein the high-frequency switch IC chip further includes a dummy electrode pad on the surface at the outer periphery of the high-frequency switch IC chip, the dummy electrode pad being insulated from the high-frequency switch IC chip and joined to the ground wiring of the first wiring layer via a bump.

18. The switch according to claim 1, wherein
one other input terminal electrically connected to the input terminal is arranged at a position point-symmetric to the input terminal with respect to the center point on the surface of the high-frequency switch IC chip,
the input terminal is electrically connected to the input terminal wiring of the wiring substrate via a bump, and
the one other input terminal is electrically connected to the input terminal wiring of the wiring substrate via one other bump.

19. The switch according to claim 1, wherein the plurality of output terminal wirings of the first wiring layer are separated from each other in a horizontal plane with the ground wiring interposed between the output terminal wirings.

* * * * *